United States Patent
Tesson et al.

(10) Patent No.: US 9,391,214 B2
(45) Date of Patent: Jul. 12, 2016

(54) VARACTOR STRUCTURE

(71) Applicant: NXP B.V., Eindhoven (NL)

(72) Inventors: Olivier Tesson, Caen (FR); Mathieu Perin, Caen (FR); Laure Rolland du Roscoat, Caen (FR)

(73) Assignee: NXP B.V., Eindhoven (NL)

( * ) Notice: Subject to any disclaimer, the term of this patent is extended or adjusted under 35 U.S.C. 154(b) by 0 days.

(21) Appl. No.: 14/635,018

(22) Filed: Mar. 2, 2015

(65) Prior Publication Data
US 2015/0255630 A1    Sep. 10, 2015

(30) Foreign Application Priority Data

Mar. 7, 2014   (EP) ..................... 14290058

(51) Int. Cl.
| | | |
|---|---|---|
| *H01L 29/93* | (2006.01) | |
| *H03B 5/12* | (2006.01) | |
| *H01L 29/66* | (2006.01) | |
| *H01L 27/08* | (2006.01) | |
| *H01L 29/94* | (2006.01) | |
| *H01L 29/423* | (2006.01) | |
| *H01L 23/482* | (2006.01) | |

(52) U.S. Cl.
CPC ............ *H01L 29/93* (2013.01); *H01L 23/4824* (2013.01); *H01L 27/0808* (2013.01); *H01L 27/0811* (2013.01); *H01L 29/423* (2013.01); *H01L 29/66174* (2013.01); *H01L 29/94* (2013.01); *H03B 5/124* (2013.01); *H03B 5/1243* (2013.01)

(58) Field of Classification Search
None
See application file for complete search history.

(56) References Cited

U.S. PATENT DOCUMENTS

| | | | |
|---|---|---|---|
| 2010/0244113 A1 | 9/2010 | Rieh et al. | |
| 2012/0281336 A1* | 11/2012 | Marino | ............... H01G 7/00 |
| | | | 361/281 |
| 2014/0036406 A1* | 2/2014 | Tesson | ............... H01L 23/4824 |
| | | | 361/281 |
| 2015/0084107 A1* | 3/2015 | Li | ............... H01L 23/5223 |
| | | | 257/300 |

FOREIGN PATENT DOCUMENTS

EP           2 693 478 A1     2/2014

OTHER PUBLICATIONS

Oh, Yongho et al; "The Island-Gate Varactor—A High-Q MOS Varactor for Millimeter-Wave Applications"; IEEE Microwave and Wireless Components Letters, vol. 19, No. 4; pp. 215-217 (Apr. 2009).

Kim, Namhyung et al; "A 47 GHz LC Cross-Coupled VCO Employing High-Q Island-Gate Varactor for Phase Noise Reduction"; IEEE Microwave and Wireless Components Letters, vol. 20, No. 2; pp. 94-96 (Feb. 2010).

Morandini, Yvan et al; "High Frequency Characterization of Compact N+Poly/Nwell Varactor using Waffle-Layout"; IEEE Topical Meeting on Silicon Monolithic Integrated Circuits in RF Systems—Jan. 23-25, 2008, Orlando, FL; pp. 167-170 (2008).

Cheng, Wang-Chi et al; "A Sub01 V 1.6 GHz CMOS VCO with 29% Tuning Range"; Proceedings of the 1st European Microwave Integrated Circuits Conference, Manchester, UK; 4 pages (Sep. 2006).

Extended European Search Report for application 14290058.8 (Sep. 1, 2014).

* cited by examiner

*Primary Examiner* — Minh-Loah Tran

(57) ABSTRACT

A MOS varactor structure comprising a semiconductor body having a well region and a plurality of gate electrodes and a plurality of cathode electrodes arranged over the well region, wherein the gate electrodes comprise elongate pads, and the plurality of cathode contacts are connected by a cathode connection pattern, the cathode connection pattern comprising a plurality of arms, each of the plurality of arms arranged to extend over a part of a respective gate electrode pad.

20 Claims, 4 Drawing Sheets

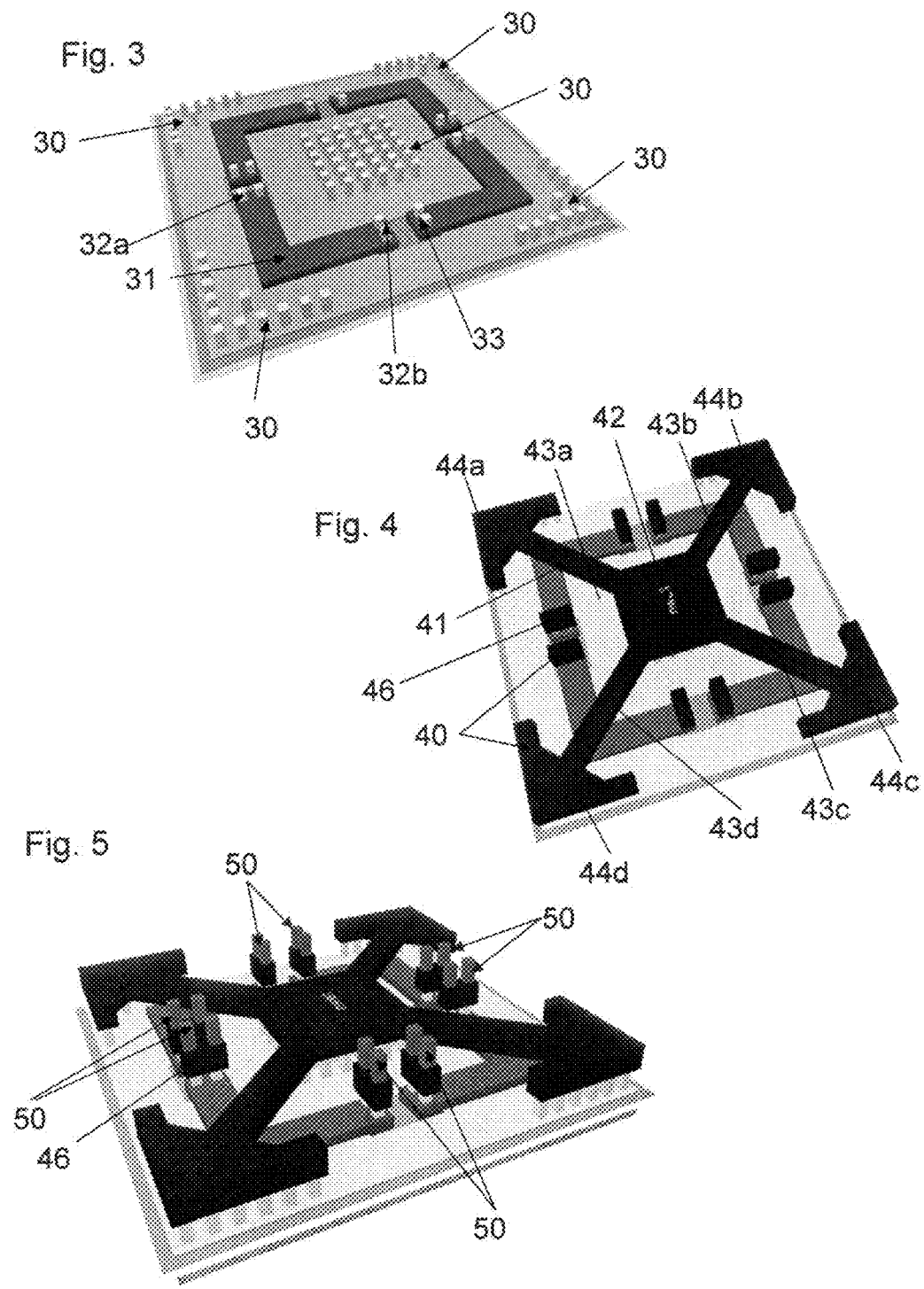

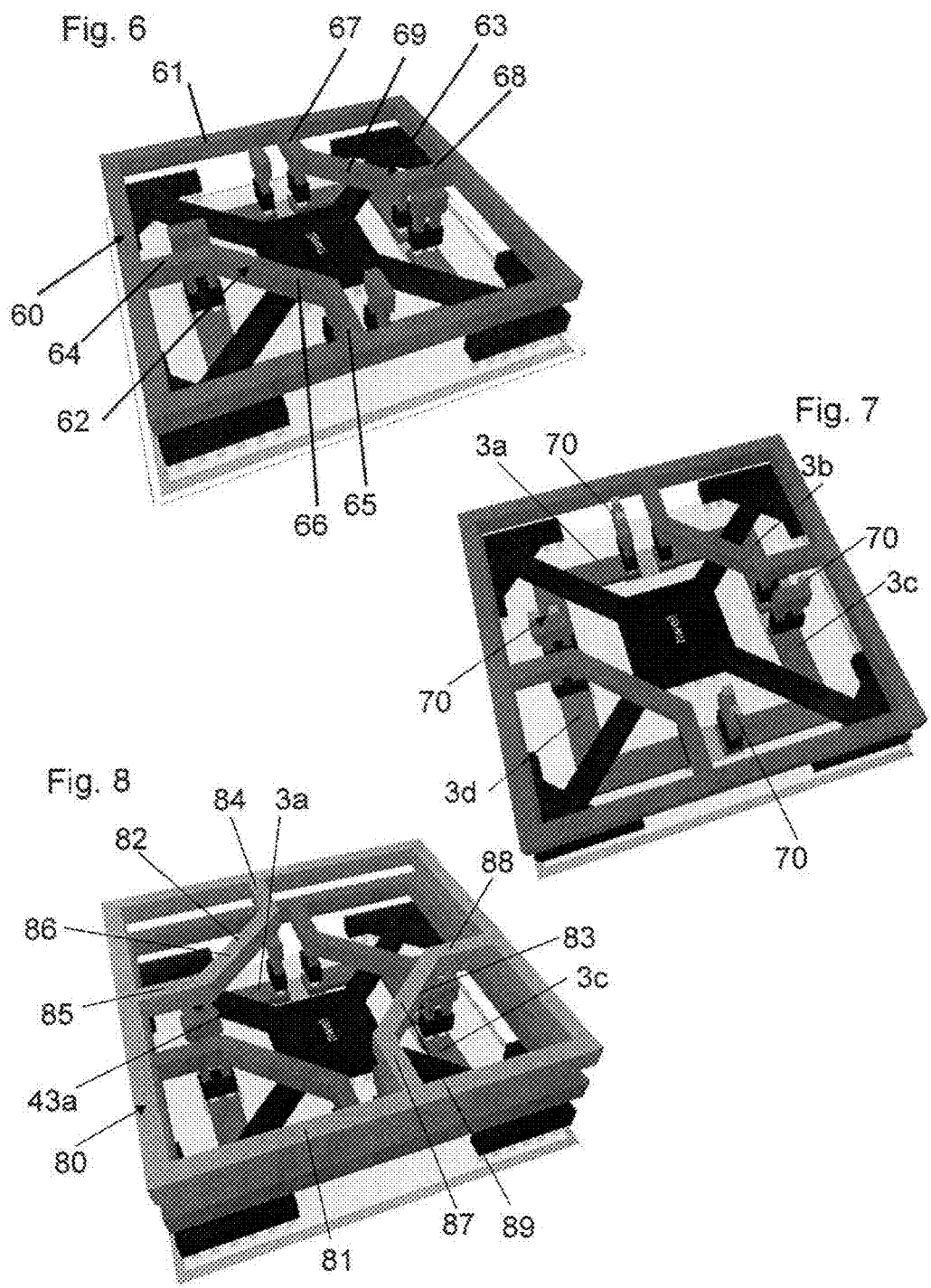

Unit cell 1a   1b

VARACTOR STRUCTURE

CROSS-REFERENCE TO RELATED APPLICATIONS

This application claims the priority under 35 U.S.C. §119 of European patent application no. 14290058.8, filed on Mar. 7, 2014, the contents of which are incorporated by reference herein.

This invention relates to a varactor structure and, in particular, to a Metal-Oxide Semiconductor (MOS) varactor structure.

A varactor comprises a type of diode which can be used as a voltage controlled capacitor. Varactors have particular application in RF and millimeter-wave local oscillators. The layout of the structure of the varactor is important to achieve high performance.

For both high frequency and performance applications (band Ku, K, Ka up to band W and THz applications) circuit designs will involve a combination of analogue and microwave design techniques and may incorporate transmission lines, splitters, couplers and transformers. The integration of local oscillators also presents challenges. These challenges are mainly related to the limited tuning range achievable in practical implementations and to the tight requirements in terms of phase noise performance imposed by the communication standards. To achieve low phase noise, the oscillator amplitude must be maximized. Typically, the tuning element used in integrated oscillators is the varactor. The varactor acts as a variable capacitor modifying its capacitance depending on the dc voltages applied to its terminals. The varactor performance is characterized by three parameters, the capacitance ratio (Cmax/Cmin), the tuning range TR=(Cmax−Cmin)/(Cmax+Cmin) and the quality factor Q. The former has a direct influence on the oscillator tuning characteristics since the tuning range is limited by:

1) The ratio between the fixed (parasitic) capacitances and the varactor capacitance; and
2) The voltage-frequency characteristics of the varactor (capacitance ratio).

In the low GHz frequency range, varactors show quality factors considerably higher than inductors and hence they have a light influence on the oscillator phase noise performance. However, for frequencies of 10 GHz and above, the quality factor of the varactors can seriously limit resonator performance and consequently, the oscillator phase noise.

According to a first aspect of the invention we provide a MOS varactor structure comprising a semiconductor body having a well region and a plurality of gate electrodes and a plurality of cathode electrodes arranged over the well region, wherein the gate electrodes comprise elongate pads, and the plurality of cathode contacts are connected by a cathode connection pattern, the cathode connection pattern comprising a plurality of arms, each of the plurality of arms arranged to extend over a part of a respective gate electrode pad.

Providing elongate electrodes is advantageous as interconnections between the other electrodes can pass over the elongate electrodes without completely obscuring them. Thus, in a stacked varactor structure in which interconnections between the electrodes/contacts are formed in a plurality of layers above the well region, the elongate electrodes allow for vias to provide interconnections to them while other interconnections pass over them. The well region may comprise an Nplus-Nwell or a Pplus-Pwell. The gate electrodes may form anodes of the varactor structure.

The structure may comprise four gate electrode pads arranged at apexes of a square. The "imaginary" square may be centred at the centre of the varactor structure. It will be appreciated that other numbers of gate electrodes may be provided.

The elongate pads may be L-shaped. The elongate pads may be electrically separated from one another. The semiconductor well region is common to the four electrodes. Alternatively the elongate pads may have three sections; a first section and a second section separated by a central section, the first and second section arranged perpendicular to each other and connected by the second section arranged at 45° to both the first and second sections. Thus, the electrodes may have the shape of the perimeter of a quarter of an octagon. It will be appreciated that the electrodes may have other elongate shapes and may be multi-sectional.

The elongate pads may have two end parts either side of a central part. The arms of the cathode connection pattern may be arranged to extend over the central part. One or both of the end parts may provide a connection point for a gate connection pattern. Thus, the elongate nature of the electrodes allows the cathode pattern to extend over the electrode while vias can be provided alongside (but spaced from) the cathode pattern to connect the electrodes in another interconnect metal layer.

The varactor structure may include a first gate connection pattern and a second gate connection pattern, the gate connection patterns extending in spaced layers. In particular, the cathode connection pattern may extend in a first layer, the first gate connection pattern in a second layer and the second gate connection pattern in a third layer stacked above the surface of the semiconductor body. It will be appreciated that the layers may comprise interconnect metal (IM) layers of a MOS structure.

The first gate connection pattern may be configured to provide an interconnection for a first subset of the gate electrodes. The second gate connection pattern may be configured to provide an interconnection for a second subset of the gate electrodes, the second subset comprising the gate electrodes outside the first subset. The first subset may include two gate electrodes arranged opposite one another and the second subset may include two gate electrodes arranged opposite one another. Accordingly, the MOS varactor structure may comprise a differential MOS varactor structure. The gate electrodes may be arranged, such as equally angularly spaced, around the centre of the varactor structure. The first and second subsets may contain more than two electrodes.

The first and/or second gate connection pattern may include a continuous perimeter section. This allows connections to the gate electrode(s) from any side of the varactor structure. This is advantageous as the perimeter section may define the outside edge of the pattern and, therefore, if the varactor structure is to be arranged in a grid with other varactor structures for higher capacitance, the perimeter sections provide a convenient way of interconnecting adjacent structures.

The varactor structure may be configured to be placed in an array with further varactor structures, the cathode connection pattern, first gate connection pattern and second gate connection pattern configured to form an electrical connection with corresponding patterns of an adjacent varactor structure. This "auto-abutment" feature is advantageous as an array of varactor structures may be formed for providing higher capacitances.

The varactor structure may be substantially square and the perimeter sections may be arranged at the perimeter of the structure.

The cathode connection pattern, the first gate connection pattern and the second gate connection pattern may be provided in a stacked configuration in three spaced layers.

The cathode electrodes may be provided by contacts extending from the bulk of the well region. The cathode electrodes may include a central cathode electrode within an area defined by the gate electrodes and further cathode electrodes may be arranged on a side of each of the gate electrodes directly opposite the central cathode electrode. The cathode connection pattern may therefore comprise a star shape. The cathode electrodes may include at least four further electrodes located adjacent each of the gate electrodes and further from the central electrode than the gate electrodes. The bulk of the well region may provide a diffused cathode.

The first and second gate connection patterns may include projections therefrom linked by connection bridges that extend from the perimeter section, the projections and connection bridges of the first gate connection pattern and the projections and connection bridges of the second gate connection pattern arranged such that they are non-overlapping. Further, the projections and connection bridges may be arranged to be non-overlapping with the gate electrodes other than at the point they connect to the vias of the electrodes.

According to a second aspect of the invention, we provide an integrated circuit including the varactor structure of the first aspect.

According to a third aspect of the invention we provide a method of forming a MOS varactor structure, the method including the steps of
receiving a semiconductor body having a well region with a plurality of gate electrodes and a plurality of cathode electrodes arranged over the well region, wherein the gate electrodes comprise elongate pads, and
connecting the plurality of cathode electrodes by a cathode connection pattern, the cathode connection pattern comprising a plurality of arms, each of the plurality of arms arranged to extend over a part of a respective gate electrode pad.

According to a fourth aspect of the invention, we provide an electronic device including the varactor structure of the first aspect.

The invention has application in many RF and mm-Wave frequency synthesizers and can provide low Phase Noise within the local oscillator. Further, it has application in phase locked loop integrated circuits as well as oscillators, mixers, RF heating signal synthesizers and Silicon Tuners and Q-enhanced filters and integrated RF filters and RF amplifiers.

There now follows, by way of example only, a detailed description of embodiments of the invention with reference to the following figures, in which:

FIGS. 2 to 8 shows a series of steps to form the varactor structure of FIG. 1;

Figure 1:
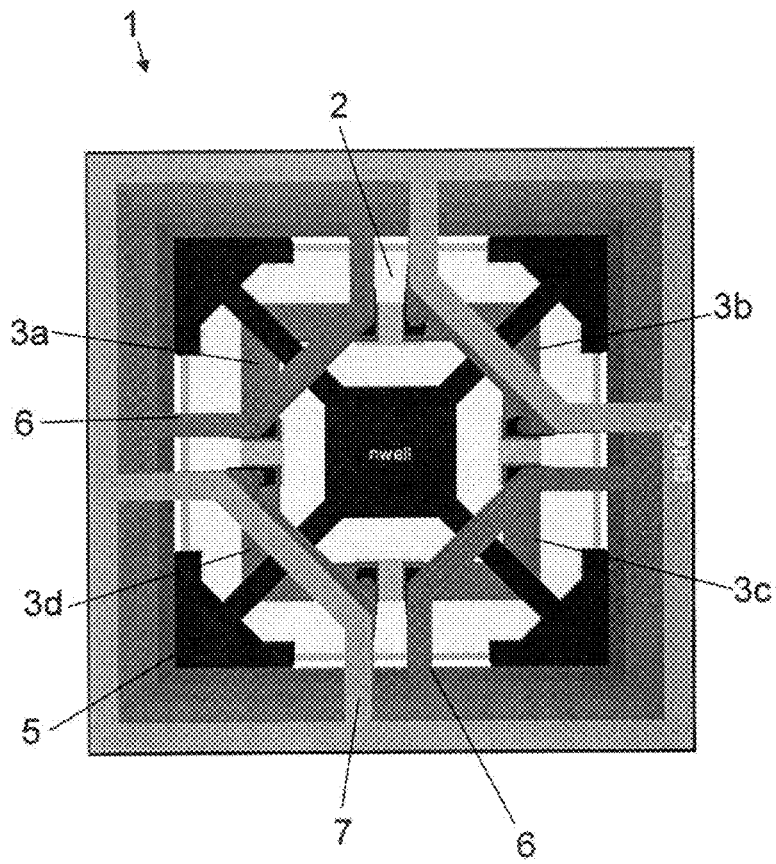
FIG. 1 shows a plan view of an exemplary varactor structure.

FIG. 1 shows a plan view of an example varactor structure 1. The varactor structure 1 is substantially square and includes an active area of a semiconductor body 2. The semiconductor body 2 includes a well region upon which the varactor structure is formed. The well region (not visible) extends into the semiconductor body 2 upon which first electrodes 3*a-d* are formed. The first electrodes 3*a-d* comprise a connection to a gate in the semiconductor body 2 and form anodes of the varactor structure 1. The first or anode electrodes are elongate structures. The first electrodes 3*a-d* may be of polysilicon. In this example, the varactor structure comprises an N+gate in N-well bulk type but may comprise a P+ gate in P-well bulk type. It will be appreciated that the structure described herein may be applied to other MOS varactor types.

The bulk of the semiconductor body on which the varactor structure is formed thus comprises a diffused cathode 4 of the varactor structure 1.

The first electrodes 3*a-d* are, in this example, L-shaped. It will be appreciated that other elongate shapes are possible. There are four first electrodes 3*a-d*, which may be termed "gate electrodes". The first, second, third and fourth gate electrodes 3*a-d* are arranged surrounding a central point of the varactor structure 1. In particular, the four anode electrodes are arranged at the apexes of a square. The square may be centred on the active area of the semiconductor body 2. The L-shaped electrodes thus extend along part of the sides of the square that extend from each of the apexes.

The elongate nature of the first electrodes may be advantageous as it allows interconnections or in-layer interconnections to pass over the elongate electrodes without completely obscuring the electrode or obscuring it to an extent that connections to the electrodes cannot be made. Thus, the elongate electrodes allow for at least one conductive track to pass over a first section of the electrode in a first layer (without connecting to the electrode) while a remaining second section provides a foundation for a via, for example, such that a connection in a second layer can provide a connection to the electrode. A varactor structures utilising the benefits of an elongate electrode may lead to improved capacitance ratio, tuning range and the quality factor Q compared to known finger-type varactors and island gate type varactors.

The varactor structure 1 includes three electrode connectors 5, 6, 7 each formed as a conducting pattern. The electrode connectors are each formed in a different metal layer, the layers extending in spaced planes that lie above the semiconductor body. The first electrode connector comprises a cathode electrode connector 5 configured to provide a connection to the well region and, further, interconnect disparate areas of the bulk. The cathode electrode connector is, in use, configured to bias the well region. The second electrode connector comprises a first gate connector 6. The first gate (or "anode") connector 6 is configured to provide a connection to a subset of the first electrodes 3*a* and 3*c*. The third electrode connector comprises a second gate (or "anode") connector 7. The second gate connector 7 is configured to provide a connection to a subset of the first electrodes, comprising the remaining electrodes 3*b* and 3*d*.

Figure 2:
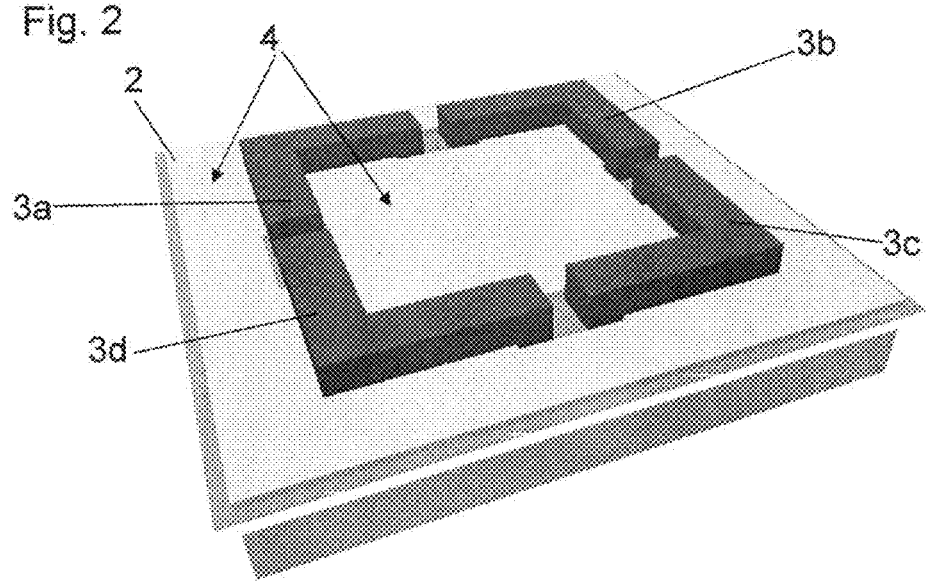

FIGS. 2 to 8 show the steps of forming the varactor structure 1. FIG. 2 shows the active area of the semiconductor body 2. The body 2 includes the first electrodes 3*a-d* formed thereon. The four first electrodes 3*a-d* are elongate and L-shaped. The four electrodes have gaps between them such that they are four distinct formations on the active area. The area of the body 2 surrounding the first electrodes 3-*d* comprises the bulk 4.

Figure 10:
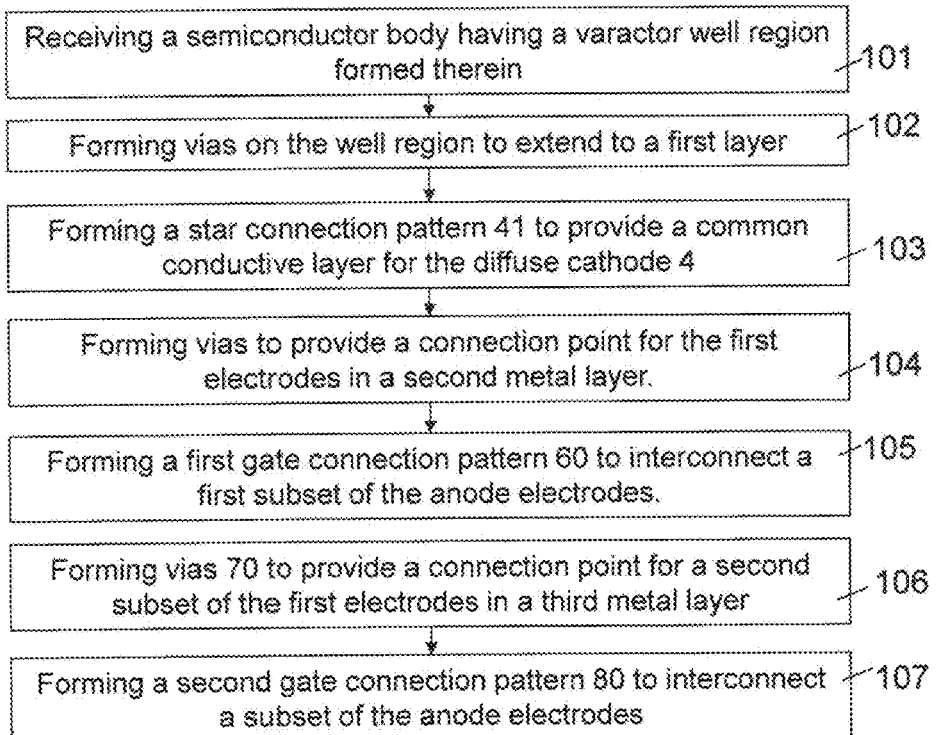
FIG. 10 shows a flow chart of an example method of assembly of the varactor structure.

The process of forming the varactor structure is shown in FIG. 10. Step 101 comprises receiving a semiconductor body 2 having a varactor well region formed therein.

FIG. 3 shows a plurality of contacts or vias 30, 33 formed over the first electrodes 3*a-d* and disparate areas of the bulk of the well region which comprises the cathode 4. In particular, the vias 30 are grouped into five groups. The first group is located within an area defined by the four first electrodes 3*a-d*, which may be at the centre of the active area. The four remaining "outer" groups are located on an opposite side of each of the elongate electrodes 3*a-d*. Thus, each of the four remaining groups lie on a line extending from the first group, radially outwardly over each of the apexes on which the four first electrodes 3*a-d* lie. Vias 33 of the first electrodes 3*a-d* extend from the ends of those electrodes. Thus, each of the first electrodes includes a central section 31 which separates two end sections 32a, 32b. The vias 33 of the first electrodes 3a-d thus extend from the end sections 32a, 32b of each of the first electrodes. The end sections each have a set of two vias 33 (although vias are shown in this example, any number may be provided). In this example, the vias at the end sections of each first electrode are grouped in pairs. The vias 30, 33 provide an electrical connection to a first interconnect metal layer.

Thus, FIG. 3 illustrates the step 102 in FIG. 10 of forming vias on the varactor well region to extend to a first layer. The vias of the gate electrodes are formed at the ends of the elongate electrodes.

FIG. 4 shows the formation of a first interconnect metal layer 40. The two vias that form each via pair from the first electrodes 3a-d are connected together in the first interconnect metal layer 40. Thus, a foundation pad 46 is formed atop each pair of "anode electrode" vias 33. A cathode or "star" connection pattern 41 comprising an electrode connector is formed in the first interconnect metal layer 40, which interconnects all of the vias 30 of the five groups. The star connection pattern 41 comprises a centre section 42 from which four arms 43a-d extend radially in equally angularly spaced directions. Each of the arms 43a-d extend over the central section 31 of a respective anode electrode 3a-d. As the arms extend in the first interconnect metal layer 40, no electrical connection is made between the arm 43a-d and the electrode 3a-d it passes over. Each of the arms terminate in a head section 44a-d. The central section 42 connects to the vias 30 of the first group and the head sections 44a-d connect to the vias of the outer groups, and the arms 43a-d interconnect the groups of vias 30. The arms of the star connection cross a width of the elongate electrodes 3a-d and therefore the parasitic capacitance between the anode electrodes and diffused cathode is low. Accordingly, the arms 43a-d may be formed narrower that the central 42 and head section 44a-d of the star connection.

Thus, FIG. 4 illustrates the step 103 in FIG. 10 of forming a star connection pattern 41 to provide a common conductive layer for the cathode 4 formed in the bulk of the well region. The star connection pattern 41 extends over part of each of the first electrodes 3a-d.

FIG. 5 shows the formation of further first electrode vias 50. The vias are grouped in pairs and are formed atop the foundation pads 46, which are located above the ends of the elongate first electrodes 3a-d. The vias 50 provide a connection to a second interconnect metal layer, which is shown in FIG. 6.

Thus, step 104 comprises forming vias to provide a connection point for the anode/gate electrodes in a second metal layer.

FIG. 6 shows the formation of a first gate connection pattern 60 in a second interconnect metal layer. The first gate connection pattern 60 is configured to interconnect a subset of the first, anode electrodes 3a-d. In this example, the pattern 60 connects two of the anode electrodes, namely second anode electrode 3b and fourth anode electrode 3d. The anode electrodes 3b and 3d are located opposite one another above the well region of the body 2. The pattern 60 comprises a peripheral ring 61 arranged to extend around a periphery of the varactor structure 1. The ring 61 is substantially square. The pattern 60 further includes a first electrode connection member 62 and a second electrode connection member 63. The members 62, 63 are located opposite one another and each connect to an inside edge of the peripheral ring 62 at two spaced locations. The first electrode connection member 62 includes a first projection 64 that extends from a first side of the square peripheral ring 61 adjacent the vias 50 that ultimately extend from the first end 32a of the fourth anode electrode 3d. The member 62 connects to said vias 50. The first electrode connection member 62 also includes a second projection 65 that extends from a second, adjacent side of the square peripheral ring 61 adjacent the vias 50 that ultimately extend from the second end 32b of the fourth anode electrode 3d. The member 62 connects to said vias 50. The distal ends of the projections 64 and 65 are connected together by bridge section 66. The bridge section 66 crosses the arm 43d and is offset from the fourth anode electrode 3d.

Likewise, the second electrode connection member 63 includes a first projection 67 that extends from a third side of the square peripheral ring 61 adjacent the vias 50 that ultimately extend from the first end 32a of the second anode electrode 3b. The member 62 connects to said vias 50. The second electrode connection member 63 also includes a second projection 68 that extends from a fourth, adjacent side of the square peripheral ring 61 adjacent the vias 50 that ultimately extend from the second end 32b of the second anode electrode 3b. The member 63 connects to said vias 50. The distal ends of the projections 67 and 68 are connected together by bridge section 69. The bridge section 69 crosses the arm 43b and is offset from the second anode electrode 3b.

FIG. 6 thus illustrates the step 105 in FIG. 10 of forming a first gate connection pattern 60 to interconnect a subset of the anode electrodes.

The further pairs of vias 50 of the first anode electrode 3a and third anode electrode 3c have foundation pads extending thereover formed in the second interconnect metal layer.

FIG. 7 shows the formation of further anode electrode vias 70. The vias are grouped in pairs and are formed atop the foundation pads formed in the second interconnect metal layer, which are located above the ends 32a, 32b of the first anode electrode 3a and the third anode electrode 3c. The vias 70 provide a connection between the second interconnect metal layer and a third interconnect metal layer, which is shown in FIG. 8.

Thus, step 106 comprises forming vias 70 to provide a connection point for a subset of the first electrodes in a third metal layer.

FIG. 8 shows the formation of a second gate connection pattern 80 in a third interconnect metal layer. The second gate connection pattern 80 is configured to interconnect a subset of the anode electrodes 3a-d. In this example, the pattern 80 connects two of the anode electrodes, namely the first anode electrode 3a and third anode electrode 3c. The anode electrodes 3a and 3c are located opposite one another above the well region of the body 2. Accordingly, the pattern 80 comprises a peripheral ring 81 arranged to extend around a periphery of the varactor structure 1. The ring 81 is substantially square. The pattern 80 further includes a first electrode connection member 82 and a second electrode connection member 83. The members 82, 83 are located opposite one another and each connect to an inside edge of the peripheral ring 82 at two spaced locations. The first electrode connection member 82 includes a first projection 84 that extends from a first side of the square peripheral ring 81 adjacent the vias 70 that ultimately extend from the first end 32a of the first anode electrode 3a. The member 82 connects to said vias 70. The first electrode connection member 82 also includes a second projection 85 that extends from a second, adjacent side of the square peripheral ring 81 adjacent the vias 70 that ultimately extend from the second end 32b of the first anode electrode 3a. The member 82 connects to said vias 70. The distal ends of the projections 84 and 85 are connected together by bridge section 86. The bridge section 86 crosses the arm 43*a* and is offset from the first anode electrode 3*a*.

Likewise, the second electrode connection member 83 includes a first projection 87 that extends from a third side of the square peripheral ring 81 adjacent the vias 70 that ultimately extend from the first end 32*a* of the third anode electrode 3*c*. The member 82 connects to said vias 70. The second electrode connection member 83 also includes a second projection 88 that extends from a fourth, adjacent side of the square peripheral ring 81 adjacent the vias 70 that ultimately extend from the second end 32*b* of the third anode electrode 3*b*. The member 83 connects to said vias 70. The distal ends of the projections 87 and 88 are connected together by bridge section 89. The bridge section 89 crosses the arm 43*c* and is offset from the third anode electrode 3*c*. The offset of the bridge sections 86, 89 and 66, 69 from the L-shaped electrodes 3*a-d* is advantageous as this reduces parallel coupling paths.

FIG. 8 thus illustrates the step 107 of FIG. 10 of forming a second gate connection pattern 80 to interconnect a subset of the anode electrodes.

Thus, the first gate connection pattern 60 provides a connection to a first subset of the anode electrodes and is accessible around the whole periphery of the structure 1 in the second interconnect metal layer. The second gate connection pattern 80 provides a connection to a second subset (i.e. the remaining anode electrodes) of the anode electrodes and is accessible around the whole periphery of the structure 1 in the third interconnect metal layer. The two gate connection patterns, which connect to opposed pairs of anode electrodes allow the device to be used differentially while having a symmetrical layout with the peripheral rings extending around the perimeter of the structure.

Figure 9:
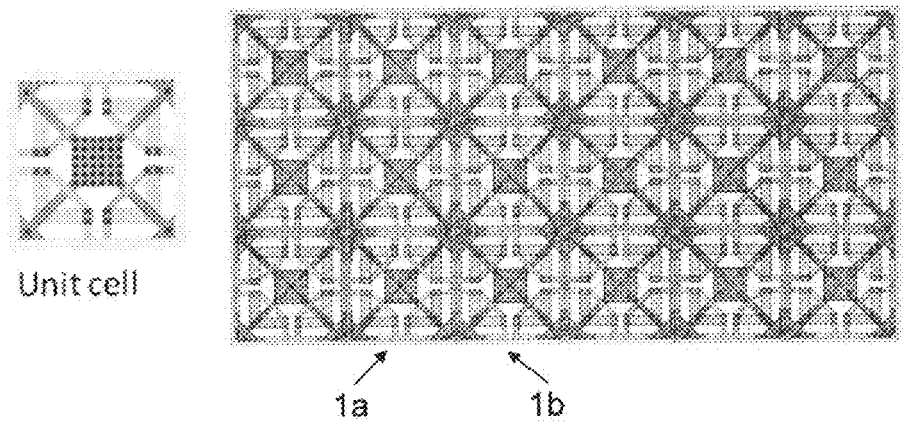
FIG. 9 shows a plurality of the varactor structures arranged adjacent one another in a grid.

FIG. 9 shows a plurality of varactor structures 1 placed in abutment with one another. Such an arrangement is advantageous in situations where high capacitance is required. In such an arrangement, the star connection pattern 41 of a first varactor structure 1*a* can electrically connect to a star connection pattern 41 of an adjacent second varactor structure 1*b*. Likewise, the first gate connection patterns 60 of the first and second varactor structures 1*a*, 1*b* can electrically connect, as can the second gate connection patterns 80. Thus, the varactor structures can be placed adjacent one another and, due to the symmetrical nature of the structure and all of the connection patterns 41, 60, 80 extending to the edges of the structure, an array of varactor structures 1 can be formed easily. The peripheral rings 61, 81 that extend around the periphery of the structure, provide a convenient and flexible connection to the anode subsets.

The invention claimed is:

1. A MOS varactor structure comprising a semiconductor body having a well region and a plurality of gate electrodes and a plurality of cathode electrodes arranged over the well region, wherein the gate electrodes comprise elongate pads, and the plurality of cathode electrodes are connected by a cathode connection pattern, the cathode connection pattern comprising a plurality of arms, each of the plurality of arms arranged to extend over a part of a respective gate electrode pad, in which the structure includes a first gate connection pattern and a second gate connection pattern, the gate connection patterns extending in spaced first and second layers.

2. A MOS varactor structure according to claim 1, in which the structure comprises four gate electrode pads arranged at apexes of a square.

3. A MOS varactor structure according to claim 1, in which the elongate pads are L-shaped.

4. A MOS varactor structure according to claim 1 in which the elongate pads have two end parts either side of a central part, wherein the arms are arranged to extend over the central part and the end parts provide a connection point for a gate connection pattern.

5. A MOS varactor structure according to claim 1, in which the first gate connection pattern is configured to provide an interconnection for a first subset of the gate electrodes and the second gate connection pattern is configured to provide an interconnection for a second subset of the gate electrodes, the second subset comprising the gate electrodes outside the first subset.

6. A MOS varactor structure according to claim 5, in which the first subset includes two gate electrodes arranged opposite one another and the second subset includes two gate electrodes arranged opposite one another.

7. A MOS varactor structure according to claim 1, in which the first and/or second gate connection pattern includes a continuous perimeter section.

8. A MOS varactor structure according to claim 7, in which the structure is substantially square and the perimeter sections are arranged at the perimeter of the structure.

9. A MOS varactor structure according to claim 1 in which the varactor structure is configured to be placed in an array with further varactor structures, the cathode connection pattern, first gate connection pattern and second gate connection pattern configured to form an electrical connection with corresponding patterns of an adjacent varactor structure.

10. A MOS varactor structure according to claim 1, in which the cathode connection pattern, the first gate connection pattern and the second gate connection pattern are provided in a stacked configuration in three spaced layers.

11. A MOS varactor structure according to claim 1 in which a bulk of the semiconductor body provides a diffused cathode.

12. A MOS varactor structure according to claim 11, in which the cathode electrodes include a central cathode electrode within an area defined by the gate electrodes and further cathode electrodes arranged on a side of each of the gate electrodes directly opposite the central cathode electrode.

13. A MOS varactor structure according to claim 12, in which the cathode electrodes include at least four further electrodes located adjacent each of the gate electrodes and further from the central cathode electrode.

14. An integrated circuit including the varactor structure of claim 1.

15. A MOS varactor structure comprising a semiconductor body having a well region and a plurality of gate electrodes and a plurality of cathode electrodes arranged over the well region, wherein the gate electrodes comprise elongate gate electrodes, and the plurality of cathode electrodes are connected by a cathode connection pattern, the cathode connection pattern comprising a plurality of arms, each of the plurality of arms arranged to extend over a part of a respective elongate gate electrode.

16. The MOS varactor structure according to claim 15, in which the elongate gate electrodes are L-shaped.

17. The MOS varactor structure according to claim 16, in which the structure comprises four L-shaped elongate gate electrodes arranged at apexes of a square.

18. The MOS varactor structure according to claim 15 in which the structure includes a first gate connection pattern and a second gate connection pattern, the gate connection patterns extending in spaced first and second layers.

19. The MOS varactor structure according to claim 18, in which the first gate connection pattern is configured to provide an interconnection for a first subset of the gate electrodes and the second gate connection pattern is configured to provide an interconnection for a second subset of the gate electrodes, the second subset comprising the gate electrodes outside the first subset.

20. The MOS varactor structure according to claim 19, in which the first subset includes two gate electrodes arranged opposite one another and the second subset includes two gate electrodes arranged opposite one another.

* * * * *